United States Patent
Su et al.

(10) Patent No.: US 7,538,615 B2
(45) Date of Patent: May 26, 2009

(54) DIFFERENTIAL FEEDBACK AMPLIFIER CIRCUIT WITH CROSS COUPLED CAPACITORS

(75) Inventors: Tung-Ming Su, Hsinchu (TW); Chun Che Lin, Hsinchu (TW)

(73) Assignee: Novatek Microelectronics Corp., Hsinchu (TW)

(*) Notice: Subject to any disclaimer, the term of this patent is extended or adjusted under 35 U.S.C. 154(b) by 0 days.

(21) Appl. No.: 11/980,708

(22) Filed: Oct. 31, 2007

(65) Prior Publication Data

US 2008/0238548 A1    Oct. 2, 2008

(30) Foreign Application Priority Data

Mar. 30, 2007   (TW) ............................. 96111185 A

(51) Int. Cl.
*H03F 3/45* (2006.01)
(52) U.S. Cl. ...................................... 330/260
(58) Field of Classification Search ................. 330/252, 330/253, 260
See application file for complete search history.

(56) References Cited

U.S. PATENT DOCUMENTS 5,652,545 A * 7/1997 Miyashita et al. ........... 330/269

* cited by examiner

*Primary Examiner*—Steven J Mottola
(74) *Attorney, Agent, or Firm*—Jianq Chyun IP Office

(57) ABSTRACT

The present invention relates to a differential feedback amplifier circuit with cross coupled capacitors. Wherein, the first and second input terminals of a source follower are respectively coupled to the first and second output terminals of a differential amplifier, and a resistor is respectively coupled between the first output terminal of the source follower and the first input terminal of the differential amplifier and between the second output terminal of the source follower and the second input terminal of the differential amplifier in order to form a feedback loop. In addition, a capacitor is respectively coupled between the first end current source gate of the source follower and the second input terminal of the source follower and between the second end current source gate of the source follower and the first input terminal of the source follower, so as to improve the circuit gain and bandwidth.

8 Claims, 7 Drawing Sheets

US 7,538,615 B2

DIFFERENTIAL FEEDBACK AMPLIFIER CIRCUIT WITH CROSS COUPLED CAPACITORS

BACKGROUND OF THE INVENTION

1. Field of the Invention

The present invention relates to a differential feedback amplifier circuit, and more particularly, to a differential feedback amplifier circuit with cross coupled capacitors.

2. Description of the Related Art

Along with the wireless communication technology development, various wireless communication standards for different environments are continuously presented to the market, such as WCDMA (Wideband Code-Division Multiple Access), WLAN (Wireless Local-Area Network), HIPERLAN (High Performance Radio Local-Area Network), UWB (Ultra-wideband), and DVB (Digital Video Broadcast), . . . etc. Among various wireless communication standards, the quality of the wireless receiver used as the RF front-end is a major factor that impacts the communication quality. Therefore, it is a common objective of the communication industry to develop a differential feedback amplifier circuit which provides high circuit gain and bandwidth and advantages of low noise, low power consumption, better linearity, and a small Integrated Circuit layout.

FIG. 1 schematically shows a broadband low-noise differential amplifier for UWB (Ultra-wideband) standard based on the thesis of "A broadband low-noise front-end amplifier for ultra wideband in 0.13 μm CMOS" issued by Gharpurey, R. in Solid-State Circuits, IEEE Journal of Volume 40, Issue 9, September 2005 pp. 1983-1986. The circuit shown in FIG. 1 has a bandwidth range of 2 GHz~5.2 GHz, which is not appropriate for the DVB (Digital Video Broadcast) standard.

FIG. 2 schematically shows a broadband low-noise differential amplifier for multistandard based on the thesis of "A new CMOS Wideband RF Front-End For Multistandard Low-IF Wireless Receivers" issued by Md. Mahbub Reja, Ahmed Allam and I. M. Filanovsky in Circuits and Systems, 2005. ISCAS 2005. pp. 2120-2123 Vol. 3. The circuit shown in FIG. 2 has a bandwidth range of 900 MHz~3.5 GHz, which is not appropriate for the DVB (Digital Video Broadcast) standard, either.

Therefore, the major topic of the field is to develop a differential feedback amplifier circuit, which complies with the DVB (Digital Video Broadcast) standard, fulfills the circuit gain and bandwidth requirements, and has the advantages of low noise, low power consumption, better linearity, and a small Integrated Circuit layout.

SUMMARY OF THE INVENTION

Therefore, it is a main objective of the present invention to provide a differential feedback amplifier circuit with cross coupled capacitors, which provides a high circuit gain and bandwidth required for the DVB (Digital Video Broadcast) RF front-end.

It is another objective of the present invention to provide a differential feedback amplifier circuit with cross coupled capacitors. The amplifier circuit has the advantages of low noise, low power consumption, better linearity, and a small Integrated Circuit layout.

To achieve the foregoing and other objectives, the present invention provides a differential feedback amplifier circuit with cross coupled capacitors. The differential feedback amplifier circuit comprises: a differential circuit, a source follower, a first resistor, a second resistor, a first capacitor, and a second capacitor. Wherein, the differential amplifier has a first input terminal, a second input terminal, a first output terminal, and a second output terminal. The source follower has a first input terminal which is coupled to the first output terminal of the differential amplifier, a second input terminal which is coupled to the second output terminal of the differential amplifier, a first end current source gate, a second end current source gate, a first output terminal, and a second output terminal. The first resistor is coupled between the first output terminal of the source follower and the first input terminal of the differential amplifier, and the second resistor is coupled between the second output terminal of the source follower and the second input terminal of the differential amplifier to form a feedback loop. In addition, the first capacitor is coupled between the first end current source gate of the source follower and the second input terminal of the source follower, and the second capacitor is coupled between the second end current source gate of the source follower and the first input terminal of the source follower, so as to improve the circuit gain and bandwidth.

In an embodiment of the present invention, the differential feedback amplifier circuit further comprises: a second stage differential amplifier, a second stage source follower, a third resistor, a fourth resistor, a fifth resistor, and a sixth resistor. Wherein, the second stage differential amplifier has a first input terminal which is coupled to the first output terminal of the source follower, a second input terminal which is coupled to the second output terminal of the source follower, a first output terminal, and a second output terminal. The second stage source follower has a first input terminal which is coupled to the first output terminal of the second stage differential amplifier, a second input terminal which is coupled to the second output terminal of the second stage differential amplifier, a first output terminal, and a second output terminal. The third resistor is coupled to the first output terminal of the second stage source follower and a first end source of the differential amplifier, the fourth resistor is coupled between the first end source of the differential amplifier and a ground terminal, the fifth resistor is coupled to the second output terminal of the second stage source follower and a second end source of the differential amplifier, and the sixth resistor is coupled between the second end source of the differential amplifier and the ground terminal.

BRIEF DESCRIPTION OF THE DRAWINGS

The accompanying drawings are included to provide a further understanding of the invention, and are incorporated in and constitute a portion of this specification. The drawings illustrate embodiments of the invention, and together with the description, serve to explain the principles of the invention.

DETAILED DESCRIPTION OF THE PREFERRED EMBODIMENTS

Figure 1:
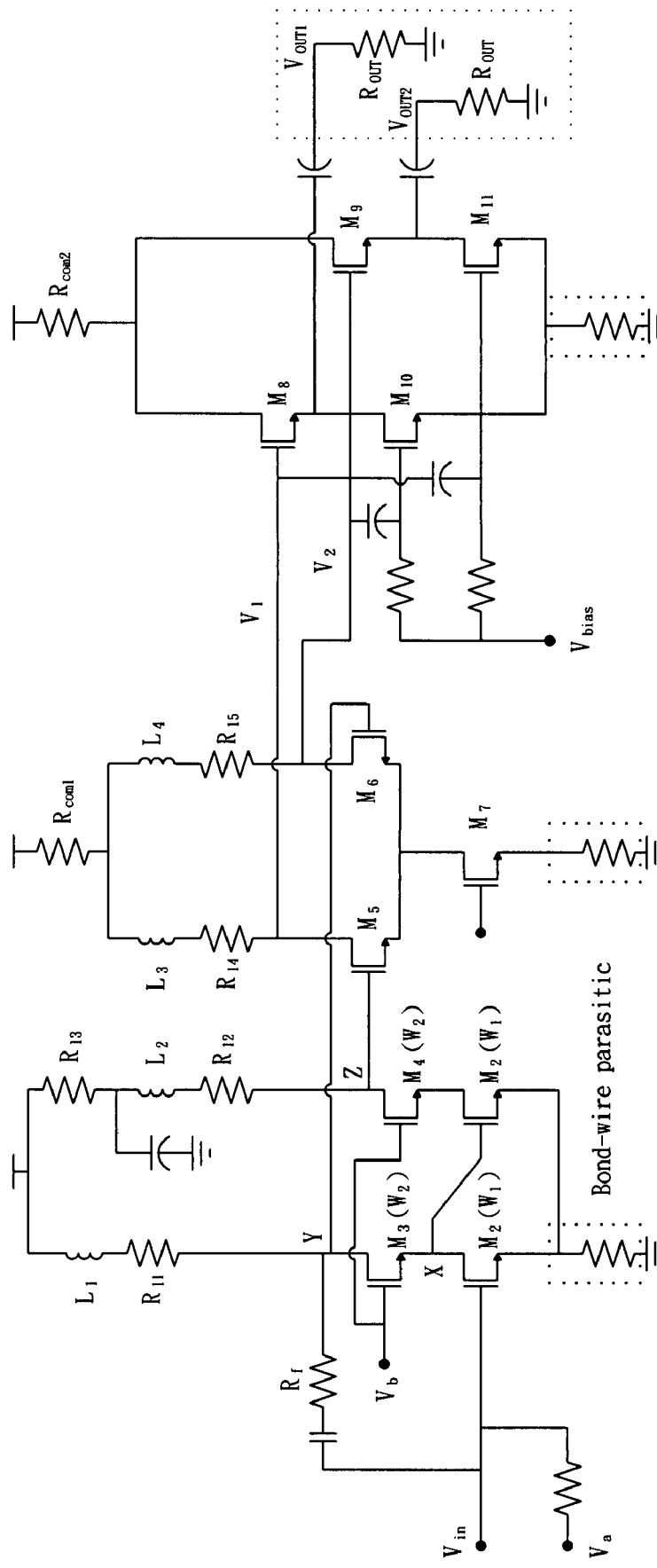
FIG. 1 is a broadband low-noise differential amplifier for UWB (Ultra-wideband) standard in the conventional technique.
Figure 2:
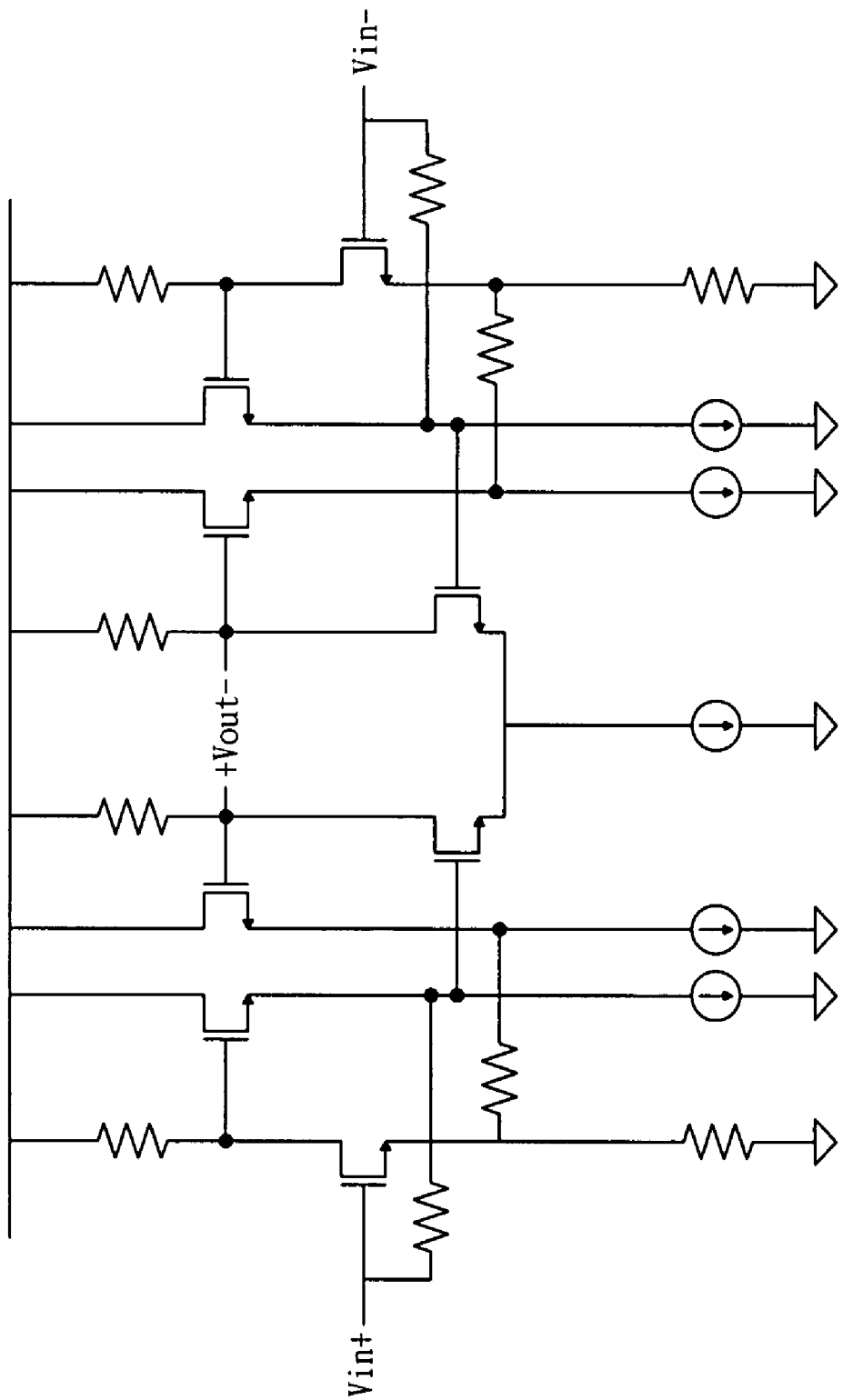
FIG. 2 is a broadband low-noise differential amplifier for multistandard in the conventional technique.
Figure 3:
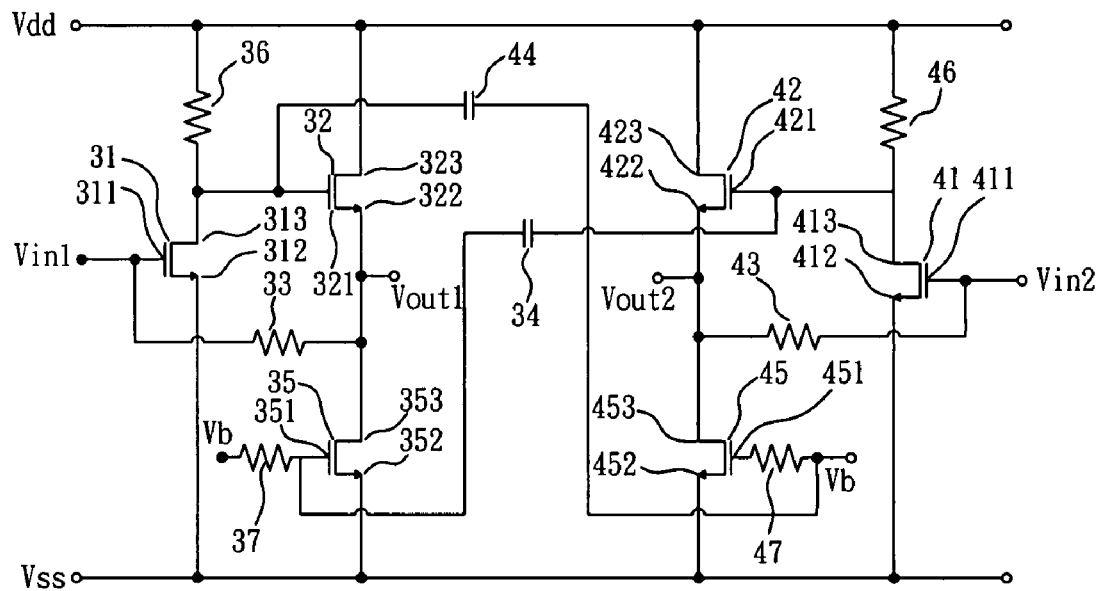
FIG. 3 schematically shows a differential feedback amplifier circuit according to a first embodiment of the present invention.
Figure 4:
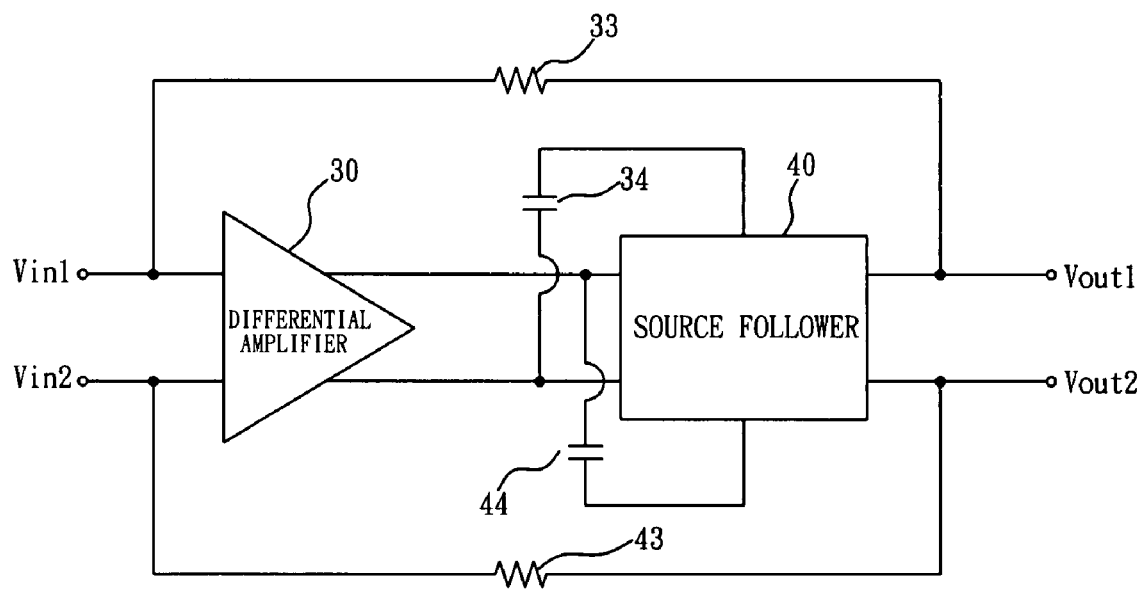
FIG. 4 shows a block schematic diagram of the circuit in FIG. 3.

Referring to FIGS. 3 and 4, wherein FIG. 3 schematically shows a differential feedback amplifier circuit according to a first embodiment of the present invention, and FIG. 4 shows a block schematic diagram of the circuit in FIG. 3. As shown in the drawings, the differential feedback amplifier circuit comprises a differential amplifier 30, a source follower 40, resistors 33 and 43, and capacitors 34 and 44.

Wherein, the differential amplifier 30 comprises transistors 31 and 41 and resistors 36 and 46, and the source follower 40 comprises transistors 32, 35, 42 and 45. A gate 311 of the transistor 31 and a gate 411 of the transistor 41 are used as a first input terminal Vin1 and a second input terminal Vin2 of the differential amplifier 30 respectively, a source 312 of the transistor 31 and a source 412 of the transistor 41 are both connected to a ground terminal Vss of the circuit, and a drain 313 of the transistor 31 (i.e. the first output terminal of the differential amplifier 30) and a drain 413 of the transistor 41 (i.e. the second output terminal of the differential amplifier 30) are connected to a power source terminal Vdd of the circuit through the resistors 36 and 46, respectively.

Therefore, the transistors 31 and 41 and the resistors 36 and 46 together form a differential amplifier 30, such that the differential signals can be input to the first input terminal Vin1 and the second input terminal Vin2 and output from the drain 313 of the transistor 31 (i.e. the first output terminal of the differential amplifier 30) and the drain 413 of the transistor 41 (i.e. the second output terminal of the differential amplifier 30).

A gate 351 of the transistor 35 and a gate 451 of the transistor 45 are both connected to a bias Vb as a first current source and a second current source of the source follower 40, respectively. A gate 321 of the transistor 32 and a gate 421 of the transistor 42 respectively are used as the first input terminal and the second input terminal of the source follower 40 and are connected to the first output terminal of the differential amplifier 30 (i.e. the drain 313 of the transistor 31) and the second putout terminal of the differential amplifier 30 (i.e. the drain 413 of the transistor 41), respectively. A drain 323 of the transistor 32 and a drain 423 of the transistor 42 are both connected to the power source terminal Vdd of the circuit. A source 322 of the transistor 32 and a source 422 of the transistor 42 are respectively connected to a drain 353 of the transistor 35 and a drain 453 of the transistor 45 as a first output terminal Vout1 and a second output terminal Vout2 of the source follower 40, respectively.

In addition, the first output terminal Vout1 and the second output terminal Vout2 of the source follower 40 are respectively connected to the first input terminal Vin1 and the second input terminal Vin2 of the differential amplifier 30 through the resistors 33 and 43, so as to form a feedback loop of the differential feedback amplifier circuit. A source 352 of the transistor 35 and a source 452 of the transistor 45 are both connected to the ground terminal Vss of the circuit.

It is characterized in this circuit that a capacitor 34 is coupled between the first end current source gate of the source follower 40 (i.e. the gate 351 of the transistor 35) and the second input terminal of the source follower 40 (i.e. the gate 421 of the transistor 42), and a capacitor 44 is coupled between the second end current source gate of the source follower 40 (i.e. the gate 451 of the transistor 45) and the first input terminal of the source follower 40 (i.e. the gate 321 of the transistor 32). With such cross coupled capacitors 34 and 44, the gain and bandwidth of the differential feedback amplifier circuit are both improved.

Figure 5:
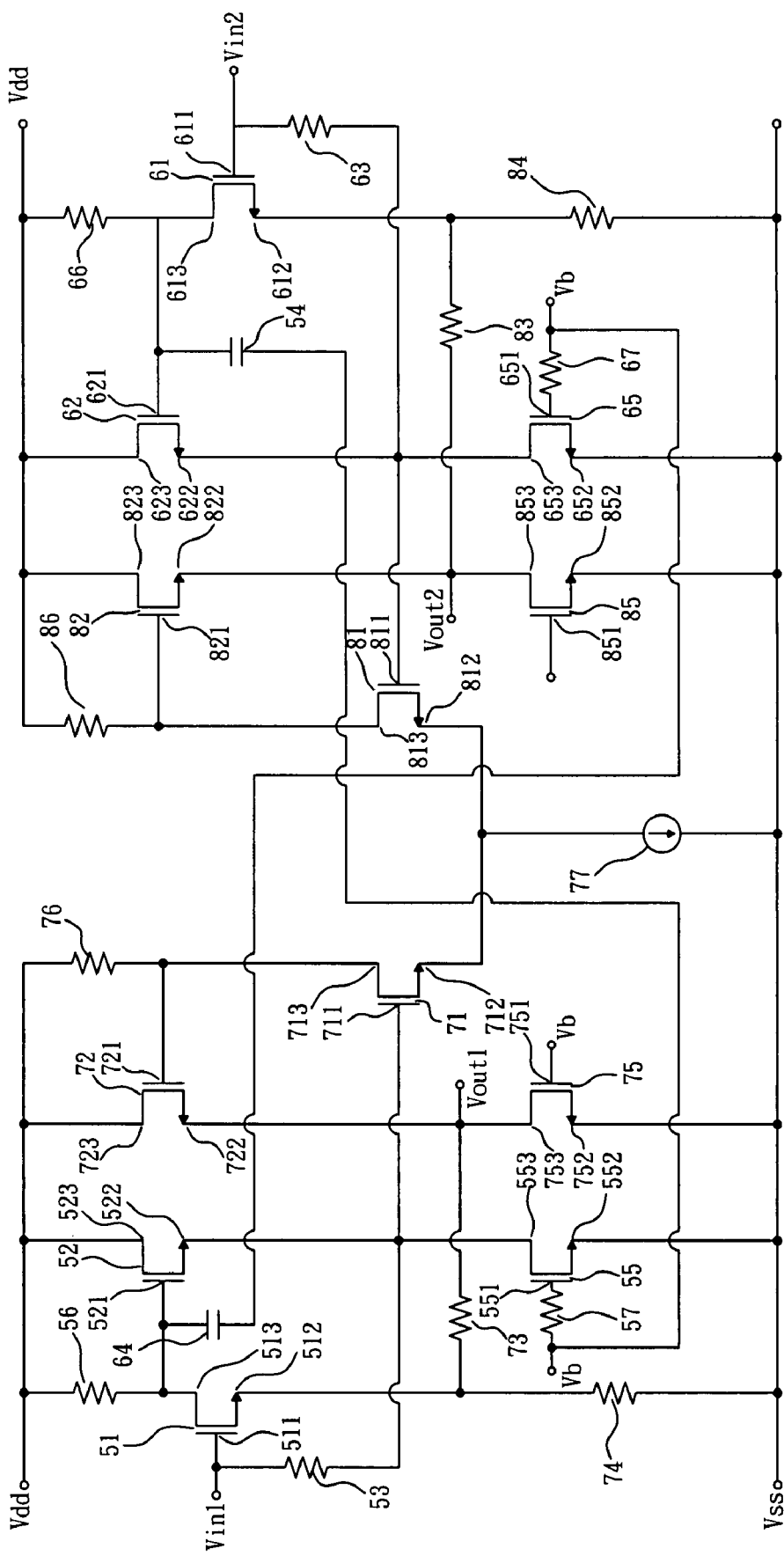
FIG. 5 schematically shows a differential feedback amplifier circuit according to a second embodiment of the present invention.
Figure 6:
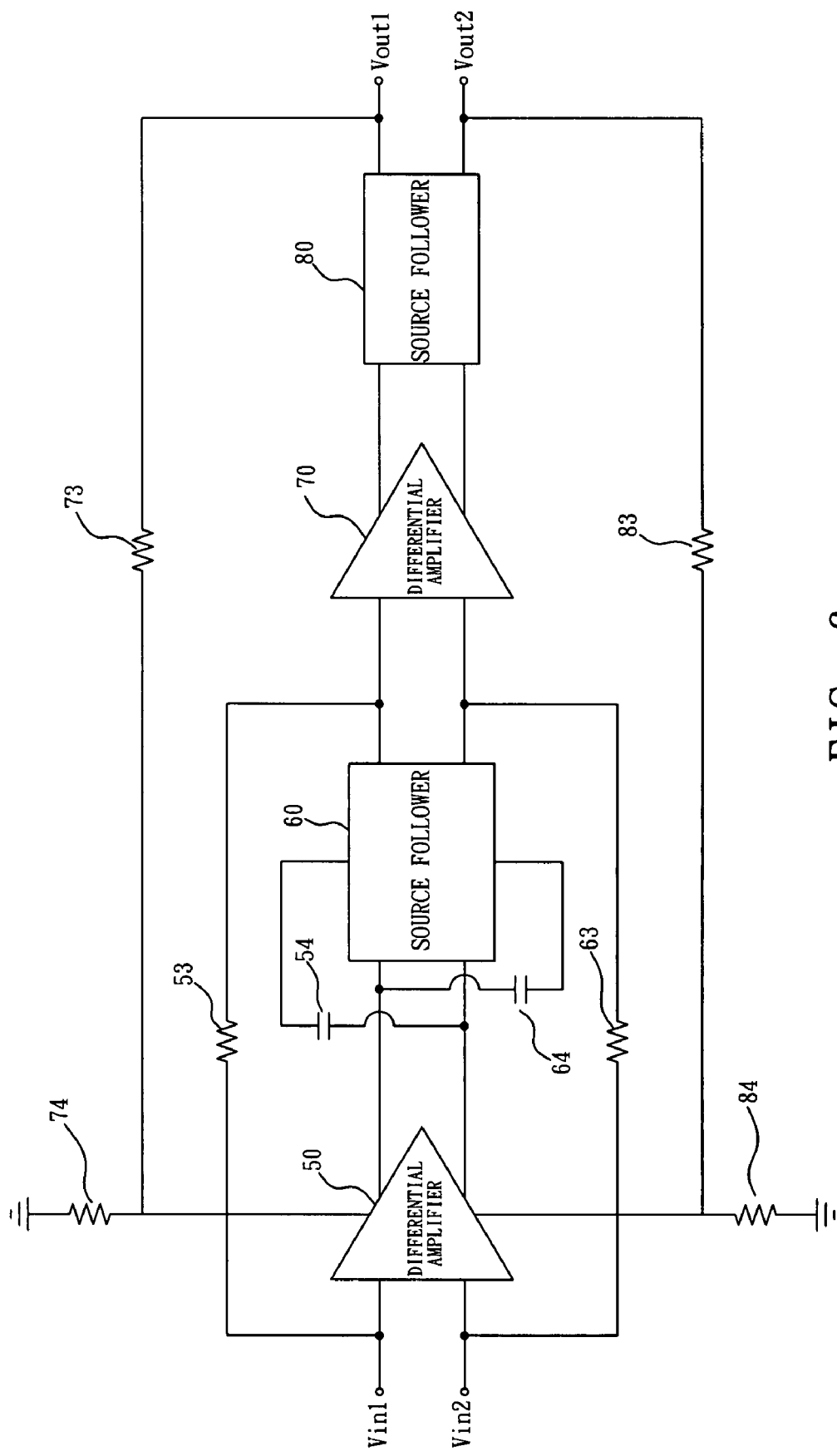
FIG. 6 shows a block schematic diagram of the circuit in FIG. 5.

Referring to FIGS. 5 and 6, wherein FIG. 5 schematically shows a differential feedback amplifier circuit according to a second embodiment of the present invention, and FIG. 6 shows a block schematic diagram of the circuit in FIG. 5. As shown in the drawing, the differential feedback amplifier circuit comprises differential amplifiers 50 and 70, source followers 60 and 80, resistors 53, 63, 73, 74, 83, and 84, and capacitors 54 and 64.

Wherein, the differential amplifier 50 comprises transistors 51 and 61 and resistors 56 and 66, and the source follower 60 comprises transistors 52, 55, 62 and 65. A gate 511 of the transistor 51 and a gate 611 of the transistor 61 are used as a first input terminal Vin1 and a second input terminal Vin2 of the differential amplifier 50 respectively, a source 512 of the transistor 51 and a source 612 of the transistor 61 are connected to a ground terminal Vss of the circuit through the resistors 74 and 84 respectively, and a drain 513 of the transistor 51 (i.e. the first output terminal of the differential amplifier 50) and a drain 613 of the transistor 61 (i.e. the second output terminal of the differential amplifier 50) are connected to a power source terminal Vdd of the circuit through the resistors 56 and 66, respectively.

Therefore, the transistors 51 and 61 and the resistors 56 and 66 together form a differential amplifier 50, such that the differential signals can be input to the first input terminal Vin1 and the second input terminal Vin2 and the magnified signals are output from the drain 513 of the transistor 51 (i.e. the first output terminal of the differential amplifier 50) and the drain 613 of the transistor 61 (i.e. the second output terminal of the differential amplifier 50).

A gate 551 of the transistor 55 and a gate 651 of the transistor 65 are both connected to a bias Vb as a first current source and a second current source of the source follower 60, respectively. A gate 521 of the transistor 52 and a gate 621 of the transistor 62 are respectively used as the first input terminal and the second input terminal of the source follower 60 and are connected to the first output terminal of the differential amplifier 50 (i.e. the drain 513 of the transistor 51) and the second putout terminal of the differential amplifier 50 (i.e. the drain 613 of the transistor 61), respectively. A drain 523 of the transistor 52 and a drain 623 of the transistor 62 are both connected to the power source terminal Vdd of the circuit. A source 522 of the transistor 52 and a source 622 of the transistor 62 are respectively connected to a drain 553 of the transistor 55 and a drain 653 of the transistor 65 as a first output terminal and a second output terminal of the source follower 60, respectively.

In addition, the first output terminal of the source follower 60 (i.e. the source 522 of the transistor 52) and the second output terminal of the source follower 60 (i.e. the source 622 of the transistor 62) are respectively connected to the first input terminal Vin1 and the second input terminal Vin2 of the differential amplifier 50 through the resistors 53 and 63, so as to form a first feedback loop of the differential feedback amplifier circuit. A source 552 of the transistor 55 and a source 652 of the transistor 65 are both connected to the ground terminal Vss of the circuit.

In comparison with the circuit shown in FIGS. 3 and 4, in which the source 312 of the transistor 31 and the source 412 of the transistor 41 are directly connected to the ground terminal Vss of the circuit, the source 512 of the transistor 51 (i.e. the first end source) and the source 612 of the transistor 61 (i.e. the second end source) in FIGS. 5 and 6 are connected to the ground terminal Vss of the circuit through the resistors 74 and 84 respectively. Besides this, the differential feedback amplifier circuit of the present embodiment further comprises a second stage differential amplifier 70 and a second stage source follower 80.

Wherein, the second stage differential amplifier 70 comprises transistors 71 and 81, a current source 77, and resistors 76 and 86. The second stage source follower 80 comprises transistors 72, 75, 82 and 85. A gate 711 of the transistor 71 and a gate 811 of the transistor 81 are respectively used as a first input terminal and a second input terminal of the second stage differential amplifier 70, and are also respectively connected to the first output terminal of the source follower 60 (i.e. the source 522 of the transistor 52) and the second output terminal of the source follower 60 (i.e. the source 622 of the transistor 62). A source 712 of the transistor 71 and a source 812 of the transistor 81 are connected to the ground terminal Vss through the current source 77. A drain 713 of the transistor 71 (i.e. the first output terminal of the second stage differential amplifier 70) and a drain 813 of the transistor 81 (i.e. the second output terminal of the second stage differential amplifier 70) are connected to a power source terminal Vdd of the circuit through the resistors 76 and 86, respectively.

Therefore, the transistors 71 and 81, the current source 77, and the resistors 76 and 86 together form a second stage differential amplifier 70, such that the differential signals output from the first output terminal and the second output terminal of the source follower 60 are magnified and then output from the drain 713 of the transistor 71 (i.e. the first output terminal of the differential amplifier 70) and the drain 813 of the transistor 81 (i.e. the second output terminal of the differential amplifier 70).

A gate 751 of the transistor 75 and a gate 851 of the transistor 85 are both connected to a bias Vb as a first current source and a second current source of the second stage source follower 80, respectively. A gate 721 of the transistor 72 and a gate 821 of the transistor 82 are respectively used as the first input terminal and the second input terminal of the second stage source follower 80 and are connected to the first output terminal of the second stage differential amplifier 70 (i.e. the drain 713 of the transistor 71) and the second putout terminal of the second stage differential amplifier 70 (i.e. the drain 813 of the transistor 81), respectively. A drain 723 of the transistor 72 and a drain 823 of the transistor 82 are both connected to the power source terminal Vdd of the circuit. A source 722 of the transistor 72 and a source 822 of the transistor 82 are respectively connected to a drain 753 of the transistor 75 and a drain 853 of the transistor 85 as a first output terminal and a second output terminal of the second stage source follower 80, respectively.

In addition, the first output terminal of the second stage source follower 80 (i.e. the source 722 of the transistor 72) and the second output terminal of the second stage source follower 80 (i.e. the source 822 of the transistor 82) are respectively connected to the source 512 of the transistor 51 (i.e. the first end source) and the source 612 of the transistor 61 (i.e. the second end source) of the differential amplifier 50 through the resistors 73 and 83, so as to form a second feedback loop of the differential feedback amplifier circuit. A source 752 of the transistor 75 and a source 852 of the transistor 85 are both connected to the ground terminal Vss of the circuit.

It is characterized in this circuit that a capacitor 54 is coupled between the first end current source gate of the source follower 60 (i.e. the gate 551 of the transistor 55) and the second input terminal of the source follower 60 (i.e. the gate 621 of the transistor 62), and a capacitor 64 is coupled between the second end current source gate of the source follower 60 (i.e. the gate 651 of the transistor 65) and the first input terminal of the source follower 60 (i.e. the gate 521 of the transistor 52). With such cross coupled capacitors 54 and 64, the gain and bandwidth of the differential feedback amplifier circuit are both improved.

Figure 7:
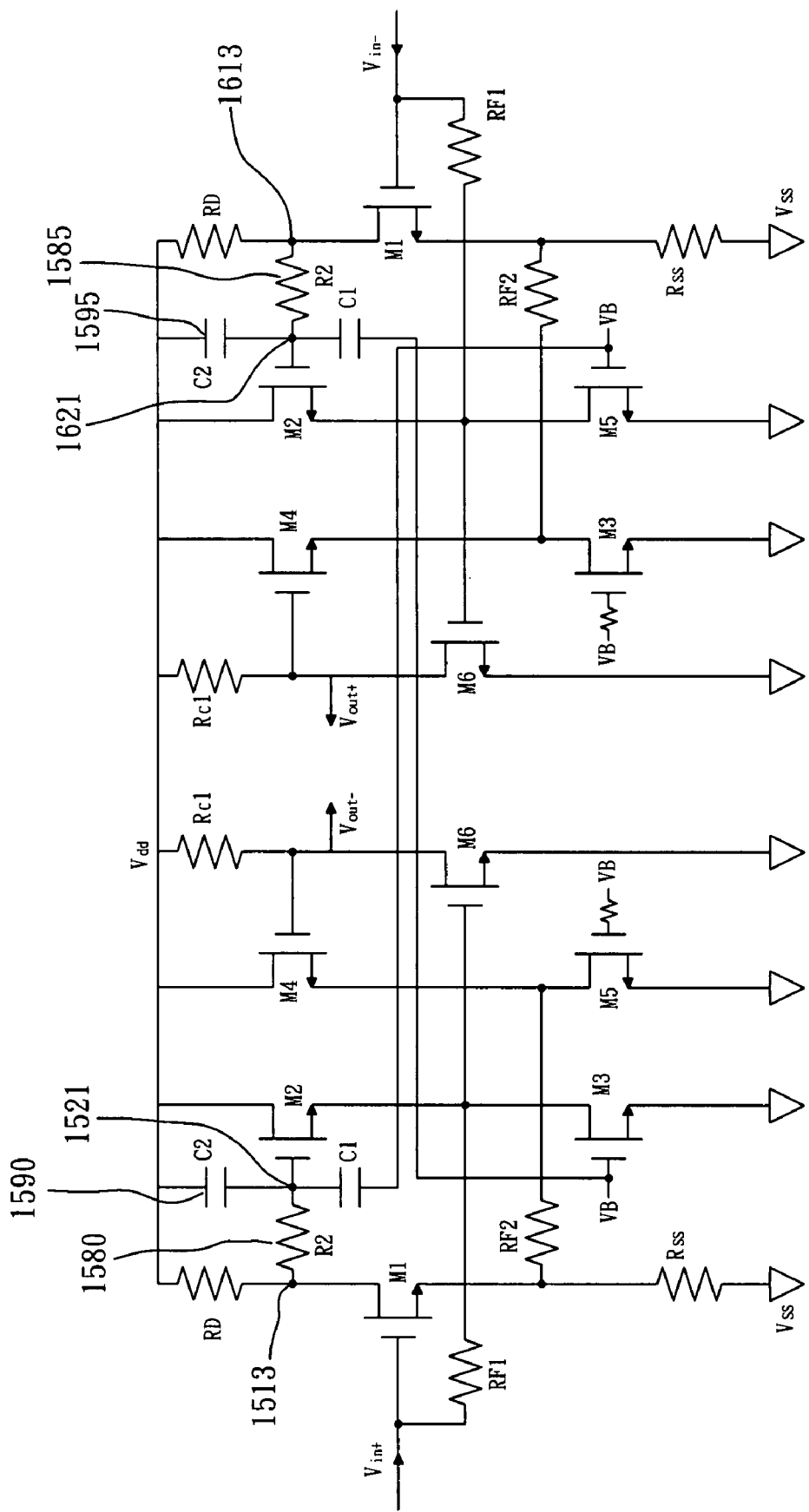
FIG. 7 schematically shows a differential feedback amplifier circuit according to a third embodiment of the present invention.

Referring to FIG. 7, which schematically shows a differential feedback amplifier circuit according to a third embodiment of the present invention. The circuit shown in FIG. 7 is similar to the one shown in FIG. 5. The difference is that a resistor 1580 is coupled between the first output terminal 1513 of the first stage differential amplifier and the first input terminal 1521 of the first stage source follower, and a capacitor 1590 is coupled between the power source terminal Vdd and the first input terminal 1521 of the first stage source follower in FIG. 7. In addition, a resistor 1585 is coupled between the second output terminal 1613 of the first stage differential amplifier and the second input terminal 1621 of the first stage source follower, and a capacitor 1595 is coupled between the power source terminal Vdd and the second input terminal 1621 of the first stage source follower in FIG. 7. The reason for this implementation is the possible demand of the high value of capacitance for the cross coupled capacitors 54 and 64 in the circuit of FIG. 5, which occupies a large chip space. Accordingly, the capacitors 1590 and 1595 are connected in parallel to divide voltage, such that the performance of the cross coupled capacitors 54 and 64 is improved.

Figure 8:
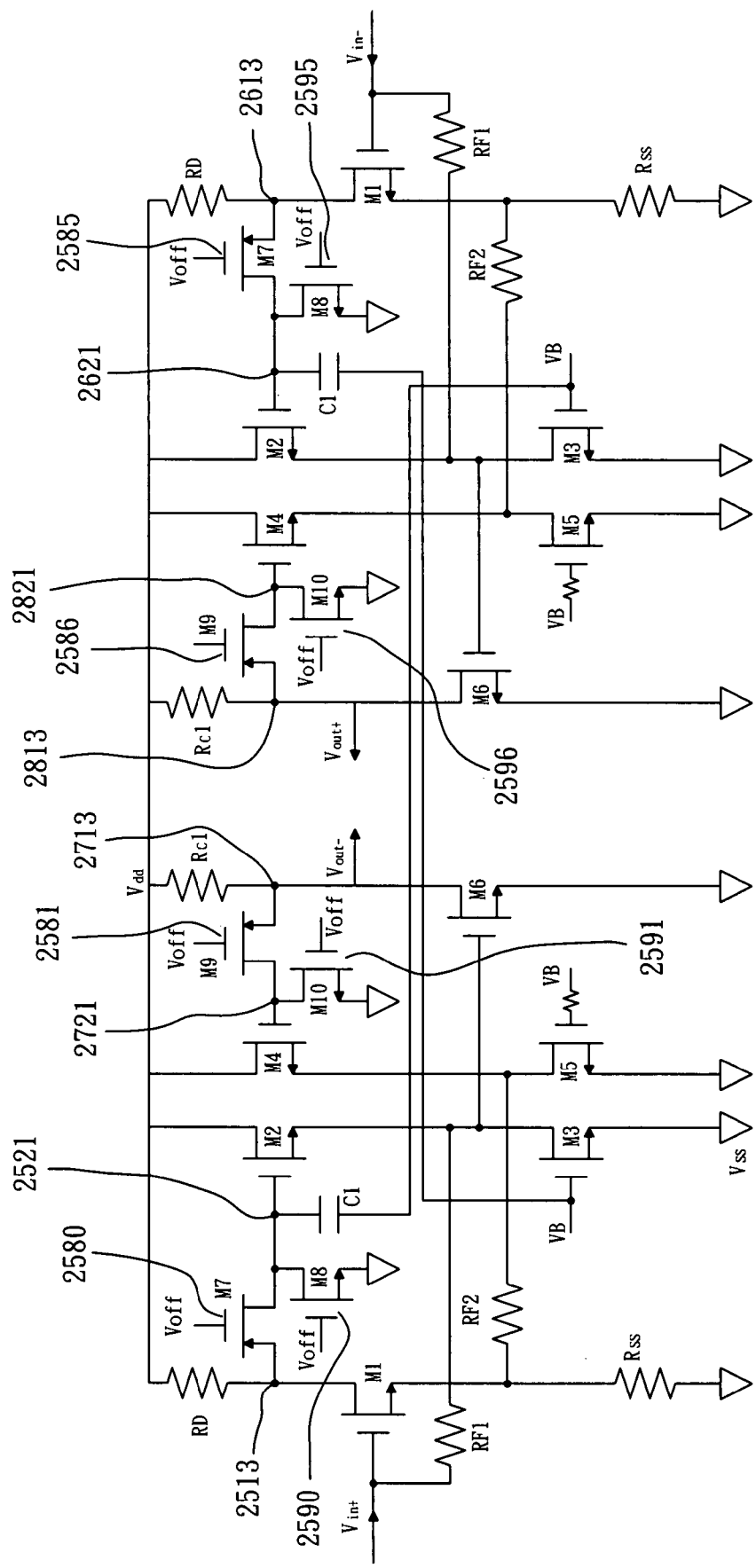
FIG. 8 schematically shows a differential feedback amplifier circuit according to a fourth embodiment of the present invention.

Referring to FIG. 8, which schematically shows a differential feedback amplifier circuit according to a fourth embodiment of the present invention. The circuit shown in FIG. 8 is similar to the one shown in FIG. 5. The difference is that a transistor 2580 is coupled between the first output terminal 2513 of the first stage differential amplifier and the first input terminal 2521 of the first stage source follower, and a transistor 2590 is coupled between the first input terminal 2521 of the first stage source follower and the ground terminal Vss in FIG. 8. In addition, a transistor 2581 is coupled between the first output terminal 2713 of the second stage differential amplifier and the first input terminal 2721 of the second stage source follower, and a transistor 2591 is coupled between the first input terminal 2721 of the second stage source follower and the ground terminal Vss. Additionally, a transistor 2585 is coupled between the second output terminal 2613 of the first stage differential amplifier and the second input terminal 2621 of the first stage source follower, and a transistor 2595 is coupled between the second input terminal 2621 of the first stage source follower and the ground terminal Vss. In addition, a transistor 2586 is coupled between the second output terminal 2813 of the second stage differential amplifier and the second input terminal 2821 of the second stage source follower, and a transistor 2596 is coupled between the second input terminal 2821 of the second stage source follower and the ground terminal Vss. Such design does not only provide the parallel voltage division effect of the voltage-divided capacitors 1590 and 1595 of FIG. 7 for increasing the effectiveness of the cross coupled capacitors 54 and 64, but also can be used as a switch circuit for cutting off the resistor feedback.

It is shown from the experiment results that the differential feedback amplifier circuit with cross coupled capacitors of the present invention indeed improves the effectiveness of the gain and bandwidth of the amplifier circuit. In addition, the amplifier circuit has the advantages of low noise, low power consumption, and a small Integrated Circuit layout. Accordingly, since it is not required to use large size conductors as circuit parts to improve the gain and bandwidth of the amplifier circuit, the objective of reducing the Integrated Circuit layout is achieved.

Although the invention has been described with reference to a particular embodiment thereof, it will be apparent to one of the ordinary skills in the art that modifications to the described embodiment may be made without departing from the spirit of the invention. Accordingly, the scope of the invention will be defined by the attached claims not by the above detailed description.

What is claimed is:

1. A differential feedback amplifier circuit with cross coupled capacitors, comprising:
    a differential amplifier, having a first input terminal, a second input terminal, a first output terminal, and a second output terminal;
    a source follower, having a first input terminal coupled to said first output terminal of said differential amplifier, a second input terminal coupled to said second output terminal of said differential amplifier, a first end current source gate, a second end current source gate, a first output terminal, and a second output terminal;
    a first resistor, coupled between said first output terminal of said source follower and said first input terminal of said differential amplifier;
    a second resistor, coupled between said second output terminal of said source follower and said second input terminal of said differential amplifier;
    a first capacitor, coupled between said first end current source gate of said source follower and said second input terminal of said source follower; and
    a second capacitor, coupled between said second end current source gate of said source follower and said first input terminal of said source follower.

2. The differential feedback amplifier circuit of claim 1, wherein said differential amplifier comprises:
    a first transistor, having a gate as said first input terminal of said differential amplifier, a source coupled to a ground terminal, and a drain as said first output terminal of said differential amplifier;
    a first resistor, coupled between a power source terminal and said drain of said first transistor;
    a second transistor, having a gate as said second input terminal of said differential amplifier, a source coupled to said ground terminal, and a drain as said second output terminal of said differential amplifier; and
    a second resistor, coupled between said power source terminal and said drain of said second transistor.

3. The differential feedback amplifier circuit of claim 1, wherein said source follower comprises:
    a first transistor, having a gate as said first input terminal of said source follower, a source as said first output terminal of said source follower, and a drain coupled to a power source terminal;
    a second transistor, having a gate coupled to a bias as said first end current source gate, a source coupled to a ground terminal, and a drain coupled to said source of said first transistor;
    a third transistor, having a gate as said second input terminal of said source follower, a source as said second output terminal of said source follower, and a drain coupled to said power source terminal; and
    a fourth transistor, having a gate coupled to said bias as said second end current source gate, a source coupled to said ground terminal, and a drain coupled to said source of said third transistor.

4. The differential feedback amplifier circuit of claim 1, wherein said differential amplifier has a first end source and a second end source, and said differential feedback amplifier circuit further comprises:
    a second stage differential amplifier, having a first input terminal coupled to said first output terminal of said source follower, a second input terminal coupled to said second output terminal of said source follower, a first output terminal, and a second output terminal;
    a second stage source follower, having a first input terminal coupled to said first output terminal of said second stage differential amplifier, a second input terminal coupled to said second output terminal of said second stage differential amplifier, a first output terminal, and a second output terminal;
    a third resistor, coupled between said first output terminal of said second stage source follower and said first end source of said differential amplifier;
    a fourth resistor, coupled between said first end source of said differential amplifier and a ground terminal;
    a fifth resistor, coupled between said second output terminal of said second stage source follower and said second end source of said differential amplifier; and
    a sixth resistor, coupled between said second end source of said differential amplifier and said ground terminal.

5. The differential feedback amplifier circuit of claim 4, wherein said second stage differential amplifier comprises:
    a current source, having a first terminal and a second terminal coupled to said ground terminal;
    a first transistor, having a gate as said first input terminal of said second stage differential amplifier, a source coupled to said first terminal of said current source, and a drain as said first output terminal of said second stage differential amplifier;
    a first resistor, coupled between a power source terminal and said drain of said first transistor;
    a second transistor, having a gate as said second input terminal of said second stage differential amplifier, a source coupled to said first terminal of said current source, and a drain as said second output terminal of said second stage differential amplifier; and
    a second resistor, coupled between said power source terminal and said drain of said second transistor.

6. The differential feedback amplifier circuit of claim 4, wherein said second stage source follower comprises:
    a first transistor, having a gate as said first input terminal of said second stage source follower, a source as said first output terminal of said second stage source follower, and a drain coupled to a power source terminal;
    a second transistor, having a gate coupled to a bias, a source coupled to a ground terminal, and a drain coupled to said source of said first transistor;
    a third transistor, having a gate as said second input terminal of said second stage source follower, a source as said second output terminal of said second stage source follower, and a drain coupled to said power source terminal; and
    a fourth transistor, having a gate coupled to said bias, a source coupled to said ground terminal, and a drain coupled to said source of said third transistor.

7. The differential feedback amplifier circuit of claim 4, further comprising:
    a first transistor, coupled between said first output terminal of said differential amplifier and said first input terminal of said source follower;
    a second transistor, coupled between said first input terminal of said source follower and said ground terminal;

a third transistor, coupled between said second output terminal of said differential amplifier and said second input terminal of said source follower; and a fourth transistor, coupled between said second input terminal of said source follower and said ground terminal.

8. The differential feedback amplifier circuit of claim 7, further comprising:

a fifth transistor, coupled between said first output terminal of said second stage differential amplifier and said first input terminal of said second stage source follower;

a sixth transistor, coupled between said first input terminal of said second stage source follower and said ground terminal;

a seventh transistor, coupled between said second output terminal of said second stage differential amplifier and said second input terminal of said second stage source follower; and an eighth transistor, coupled between said second input terminal of said second stage source follower and said ground terminal.

\* \* \* \* \*